(12) United States Patent
Takeyama et al.

(10) Patent No.: US 7,430,134 B2
(45) Date of Patent: Sep. 30, 2008

(54) MEMORY CELL STRUCTURE OF SRAM

(75) Inventors: Yasuhisa Takeyama, Yokohama (JP); Nobuaki Otsuka, Komae (JP); Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 11/676,821

(22) Filed: Feb. 20, 2007

(65) Prior Publication Data

US 2007/0194833 A1    Aug. 23, 2007

(30) Foreign Application Priority Data

Feb. 20, 2006   (JP)   ............................. 2006-042704

(51) Int. Cl.
   *G11C 11/00* (2006.01)
(52) U.S. Cl. .............. 365/154; 365/185.14; 365/185.23
(58) Field of Classification Search ................. 365/154, 365/185.14, 185.23, 185.26, 185.07, 49, 365/189.05
   See application file for complete search history.

(56) References Cited

U.S. PATENT DOCUMENTS

| 6,853,578 B1* | 2/2005 | Zhang et al. ................. 365/154 |
| 2003/0090928 A1* | 5/2003 | Takemura .................... 365/154 |
| 2008/0074916 A1* | 3/2008 | Liaw .......................... 365/154 |

FOREIGN PATENT DOCUMENTS

JP    2005-302231    10/2005

* cited by examiner

*Primary Examiner*—Dang T Nguyen
(74) *Attorney, Agent, or Firm*—Oblon, Spivak, McClelland, Maier & Neustadt, P.C.

(57) ABSTRACT

Disclosed is an SRAM including a latch circuit, first and second write transfer gates, first and second write buffer transistors, read driver transistor, and read transfer gate. A write path is formed by connecting first and second write transfer gates and first and second write buffer transistors to the latch circuit which stores data and the path is controlled by use of a word line and data write bit lines. Further, a read path is formed by connecting a read driver transistor and read transfer gate to the latch circuit and the path is controlled by use of the word line, read bit line and data of the latch circuit.

13 Claims, 5 Drawing Sheets

MEMORY CELL STRUCTURE OF SRAM

CROSS-REFERENCE TO RELATED APPLICATIONS

This application is based upon and claims the benefit of priority from prior Japanese Patent Application No. 2006-042704, filed Feb. 20, 2006, the entire contents of which are incorporated herein by reference.

BACKGROUND OF THE INVENTION

1. Field of the Invention

This invention relates to a semiconductor memory device and more particularly to the memory cell structure of a static random access memory (SRAM) and the structure of a memory cell array having the memory cells arranged in a matrix form.

2. Description of the Related Art

In recent years, the size of transistors including memory cells is reduced in order to enhance the integration density of a semiconductor memory device. Further, the threshold voltage of the transistor is lowered with a lowering in the power supply voltage. With the reduction in the transistor size and lowering in the threshold voltage, there occurs a problem that variation in the threshold voltages of the transistors configuring the memory cell becomes large. Therefore, in the SRAM, there occurs a problem that a so-called static noise margin (SNM) becomes small due to the influence by variation in the threshold voltages of the transistors configuring the memory cell and memory cells which do not have a sufficiently large SNM are formed.

In the memory cells which do not have a sufficiently large SNM, there occurs a possibility that write disturb and read disturb will occur. That is, when the potential of a certain word line is set to an "H" level in order to write data into a memory cell or read out data from a memory cell, NMOS transfer gates of all of the memory cells connected to the word line are turned ON. At this time, in the memory cell which does not have a sufficiently large SNM and is unstable in the data holding characteristic, there occurs a possibility that the latch state of a latch circuit for data storage will be inverted and stored data will be destroyed.

The technique for stabilizing the data storage state and increasing the cell current to enhance the operation speed is disclosed in Jpn. Pat. Appln. KOKAI Publication No. 2005-302231. The memory cell structure used in the technique is attained by adding a transfer gate exclusively used for reading and a read buffer transistor to a 6-transistor SRAM cell. The 6-transistor SRAM cell is used as a data holding section and the transfer gate exclusively used for reading and read buffer transistor are used as a read stage. The threshold voltage of the transistors configuring the data holding section is set higher than the threshold voltage of the transistors configuring the read stage.

BRIEF SUMMARY OF THE INVENTION

According to one aspect of this invention, there is provided a memory cell comprising first and second inverters having input terminals respectively connected to output terminals of the other inverters, a first write transfer gate having one of source and drain terminals connected to a first common connection node of the output terminal of the first inverter and the input terminal of the second inverter and a gate terminal connected to a word line, a second write transfer gate having one of source and drain terminals connected to a second common connection node of the output terminal of the second inverter and the input terminal of the first inverter and a gate terminal connected to the word line, a first write buffer transistor having one of source and drain terminals connected to the other one of the source and drain terminals of the first write transfer gate, the other one of the source and drain terminals connected to a reference potential node and a gate terminal connected to a first bit line, a second write buffer transistor having one of source and drain terminals connected to the other one of the source and drain terminals of the second write transfer gate, the other one of the source and drain terminals connected to the reference potential node and a gate terminal connected to a second bit line, a read transfer gate having one of source and drain terminals connected to a third bit line and a gate terminal connected to the word line, and a read driver transistor having one of source and drain terminals connected to the other one of the source and drain terminals of the read transfer gate, the other one of the source and drain terminals connected to the reference potential node and a gate terminal connected to the first common connection node.

According to another aspect of this invention, there is provided a semiconductor memory device comprising a memory cell array having memory cells arranged in a matrix form, word lines each commonly connected to those of the memory cells which lie on the same row in the memory cell array, and first, second and third bit lines of groups each commonly connected to those of the memory cells which lie on the same column in the memory cell array, wherein each of the memory cells includes, first and second inverters having input terminals respectively connected to output terminals of the other inverters, a first write transfer gate having one of source and drain terminals connected to a first common connection node of the output terminal of the first inverter and the input terminal of the second inverter and a gate terminal connected to a corresponding one of the word lines, a second write transfer gate having one of source and drain terminals connected to a second common connection node of the output terminal of the second inverter and the input terminal of the first inverter and a gate terminal connected to the word line, a first write buffer transistor having one of source and drain terminals connected to the other one of the source and drain terminals of the first write transfer gate, the other one of the source and drain terminals connected to a reference potential node and a gate terminal connected to the first bit line, a second write buffer transistor having one of source and drain terminals connected to the other one of the source and drain terminals of the second write transfer gate, the other one of the source and drain terminals connected to the reference potential node and a gate terminal connected to the second bit line, a read transfer gate having one of source and drain terminals connected to the third bit line and a gate terminal connected to the word line, and a read driver transistor having one of source and drain terminals connected to the other one of the source and drain terminals of the read transfer gate, the other one of the source and drain terminals connected to the reference potential node and a gate terminal connected to the first common connection node.

DETAILED DESCRIPTION OF THE INVENTION

First Embodiment

Figure 1:
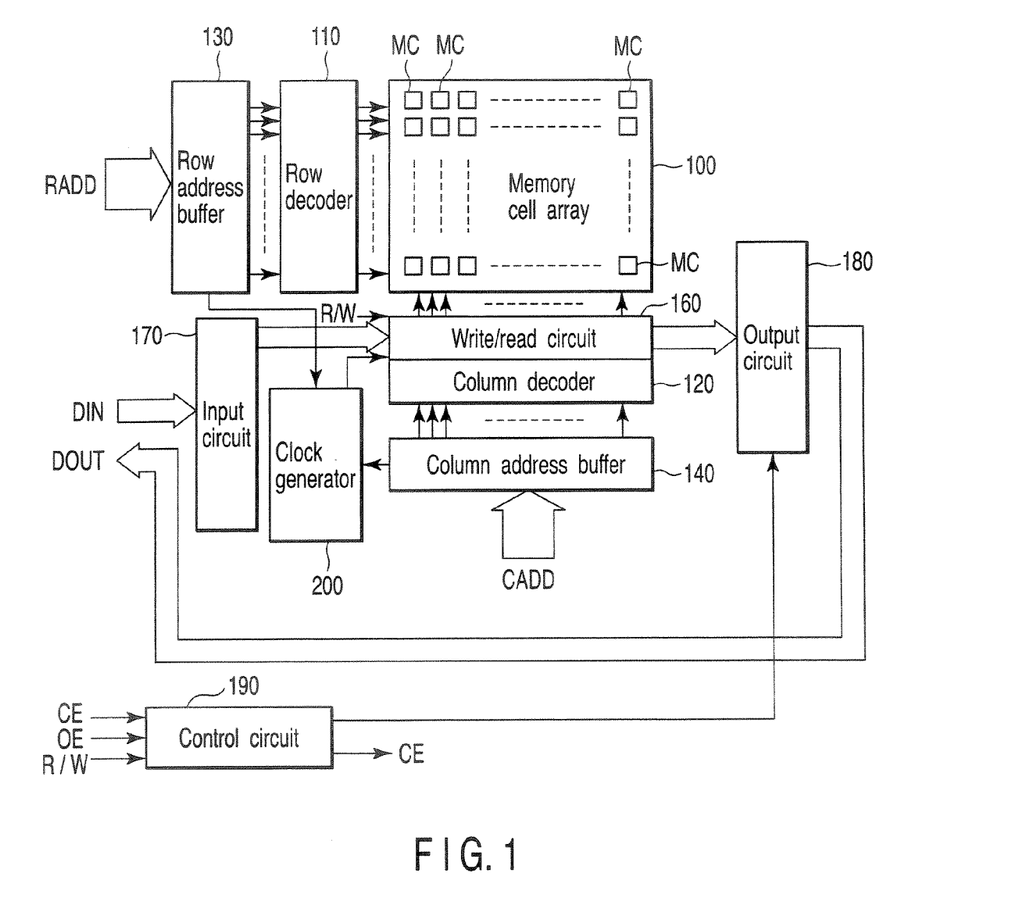
FIG. 1 is a block diagram showing the schematic configuration of an SRAM, for illustrating a semiconductor memory device according to a first embodiment of this invention.

FIG. 1 is a block diagram showing the schematic configuration of an SRAM, for illustrating a semiconductor memory device according to a first embodiment of this invention. Memory cells (SRAM cells) MC, MC, . . . are arranged in a matrix form in a memory cell array 100. The row of the memory cells MC, MC, . . . is selected by a row decoder 110 and the column of the memory cells MC, MC, . . . is specified by a column decoder 120. The row decoder 110 is supplied with a row address signal RADD input to a row address buffer 130 and a word line is selected based on the decode result of the row decoder 110. The column decoder 120 is supplied with a column address signal CADD input to a column address buffer 140 and the column of memory cells MC, MC, . . . connected to a bit line selected based on the decode result of the column decoder 120 is specified.

The bit line specified by the column decoder 120 is driven by a write/read circuit 160. At the data write time, the write/read circuit 160 sets the potential level of a bit line according to write data DIN input to an input circuit 170. Then, data is written into a memory cell MC selected by the word line and bit line of the memory cell array 100. Further, at the data read time, potential variation of a bit line connected to a selected memory cell is amplified by the sense amplifier provided in the write/read circuit 160 and supplied to an output circuit 180 and then readout data DOUT is output from the output circuit 180.

A control circuit 190 controls the respective circuits in the SRAM. For example, it controls the operation of the output circuit 180 and supplies a chip enable signal CE to the row decoder 110, row address buffer 130, column decoder 120, column address buffer 140 and the like to control the operations thereof based on a chip enable signal CE, output enable signal OE, read/write signal R/W and the like.

A clock generator 200 generates a clock to control the basic operation of the SRAM. For example, the clock generator 200 supplies an operation clock to the write/read circuit 160 in response to timing signals supplied from the row address buffer 130 and column address buffer 140.

Figure 2:
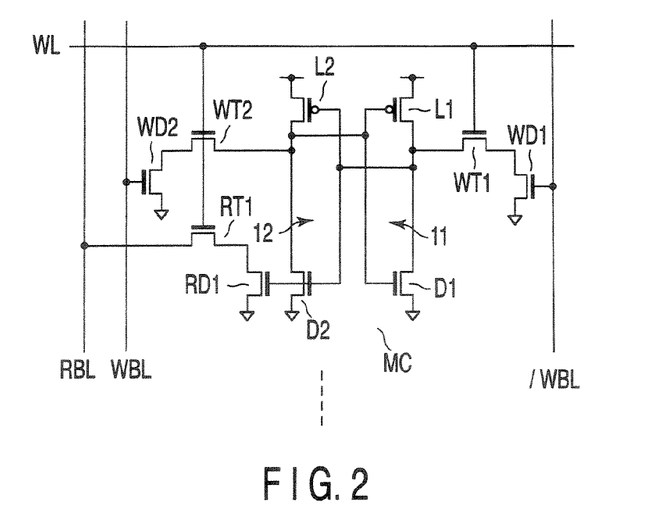
FIG. 2 is a circuit diagram of a memory cell in the SRAM shown in FIG. 1.

FIG. 2 is a circuit diagram of each of the memory cells MC, MC, . . . of the memory cell array 100 in the SRAM shown in FIG. 1. In the memory cell 100, word lines WL each commonly connected to the memory cells MC, MC, . . . on the same row and first, second and third bit lines commonly connected to the memory cells MC, MC, . . . on the same column are arranged. In this example, the first and second bit lines are respectively used as data write bit lines /WBL and WBL and the third bit line is used as a data read bit line RBL.

Each of the memory cells MC is configured by first, second inverters 11, 12, data write transfer gates WT1, WT2, write buffer transistors WD1, WD2, read transfer gate RT1 and read driver transistor RD1.

The first inverter 11 is configured by a load PMOS transistor L1 and driver NMOS transistor D1. The second inverter 12 is configured by a load PMOS transistor L2 and driver NMOS transistor D2. Each of the data write transfer gates WT1, WT2 is configured by an NMOS transistor. Each of the write buffer transistors WD1, WD2 is configured by an NMOS transistor. Each of the read transfer gate RT1 and read driver transistor RD1 is configured by an NMOS transistor.

The first inverter 11 and second inverter 12 are cross-coupled to each other with the input terminals of the inverters respectively connected to the output terminals of the other inverters to form a data latch circuit. In this example, as the first, second inverters 11, 12, CMOS inverters are used, but inverters other than the CMOS inverters can be used.

One of the source and drain terminals of the write transfer gate WT1 is connected to a common connection node of the output terminal of the first inverter 11 and the input terminal of the second inverter 12 and the gate terminal thereof is connected to the word line WL. Likewise, one of the source and drain terminals of the write transfer gate WT2 is connected to a common connection node of the output terminal of the second inverter 12 and the input terminal of the first inverter 11 and the gate terminal thereof is connected to the word line WL.

One of the source and drain terminals of the write buffer transistor WD1 is connected to the other one of the source and drain terminals of the write transfer gate WT1, the other one of the source and drain terminals thereof is connected to a reference potential node and the gate terminal thereof is connected to the first bit line /WBL. Likewise, one of the source and drain terminals of the write buffer transistors WD2 is connected to the other one of the source and drain terminals of the write transfer gate WT2, the other one of the source and drain terminals thereof is connected to the reference potential node and the gate terminal thereof is connected to the second bit line WBL.

One of the source and drain terminals of the read transfer gate RT1 is connected to the third bit line RBL and the gate terminal is connected to the word line WL. One of the source and drain terminals of the read driver transistor RD1 is connected to the other one of the source and drain terminals of the read transfer gate RT1, the other one of the source and drain terminals thereof is connected to the reference potential node and the gate terminal thereof is connected to a common connection node of the output terminal of the first inverter 11 and the input terminal of the second inverter 12.

That is, the memory cell MC of this example is configured by ten transistors in total including a 6-transistor SRAM cell, write buffer transistors WD1, WD2, and read transfer gate RT1 and read driver transistor RD1 connected to a path different from a path used when data is written.

Figure 3:
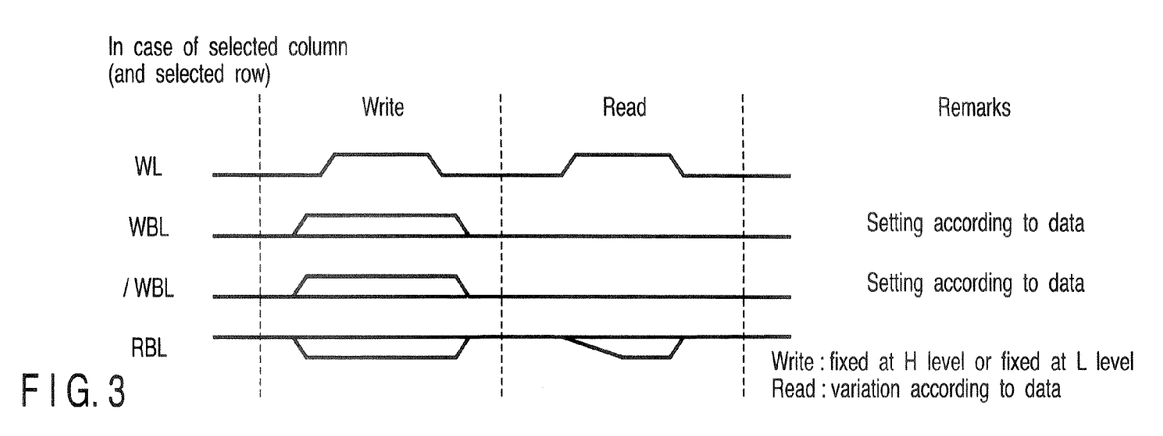
FIG. 3 is a timing chart showing signals of a selected column (and selected row), for illustrating the operation of the memory cell shown in FIGS. 1 and 2.

Next, the operation of writing data into a selected memory cell MC and the operation of reading out data from the selected memory cell in FIGS. 1 and 2 are explained with reference to the timing charts shown in FIGS. 3 and 4. First, when data is written into a selected memory cell, the potential of the word line WL of a selected row is set to an "H" level as shown in FIG. 3 and the potential of one of the bit lines WBL and /WBL of a selected column is set to an "L" level and potential of the other bit line is set to the "H" level according to data to be written. Further, the potentials of the word lines WL of non-selected rows are all set to the "L" level and both of the bit lines WBL and /WBL of each of non-selected columns are set to the "L" level. In addition, the potentials of the data read bit lines RBL are all fixed at the "H" level (or they may be fixed at the "L" level).

Since the potential of the word line WL of the selected row is set at the "H" level when data is written into the thus selected memory cell MC, the data write transfer gates WT1 and WT2 of all of the memory cells MC connected to the word line WL on the same row as that of the selected memory cell are turned ON.

Figure 4:
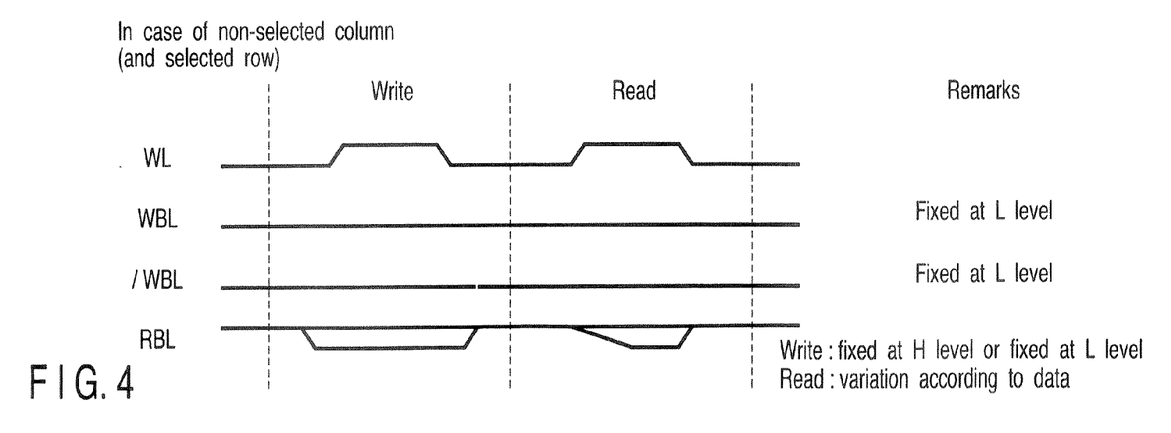
FIG. 4 is a timing chart showing signals of a non-selected column (and selected row), for illustrating the operation of the memory cell shown in FIGS. 1 and 2.

However, in each of the non-selected memory cells MC connected to the word line WL of the selected row, the potentials of both of the bit lines WBL and /WBL are set at the "L" level as shown in FIG. 4 and the write buffer transistors WD1 and WD2 are both set in the OFF state. Therefore, even if a memory cell having a small SNM and low data stability is present, data can be prevented from being destroyed.

Further, at this time, the read transfer gates RT1 of all of the memory cells connected to the word line WL on the same row as that of the selected memory cell MC are also turned ON. However, in the memory cell structure of FIG. 2, a path configured by the read transfer gate RT1 and the read driver transistor RD1 whose current path is serially connected to the transfer gate RT1 is different from the path used when data is written. Therefore, even if a memory cell having a small SNM and low data stability is present, the source and drain terminals of the read transfer gate RT1 are not connected to the inverter pair which stores data when the transfer gate RT1 is turned ON. As a result, it can be prevented that the "H" level of the data read bit line RBL is transmitted to the data latch circuit to exert influence on stored data. This is a case where initial setting is "H" level, and when initial setting is the "L" level, it is the "L" level.

As is understood from the above description, it is possible to solve a problem that data of a memory cell having a small SNM and low data stability among the non-selected cells connected to the word line of the selected row is destroyed (write disturb) at the time of data writing in the memory cell array having the memory cells of FIG. 1 arranged in a matrix form.

Further, when data is read out from the selected cell, the potential of the word line WL of the selected row is set to the "H" level and the potential of the data read bit line RBL is set to the "H" level. The potential of the data read bit line RBL of the selected column is changed to the "H" level or "L" level according to stored data. At this time, the word line WL of the non-selected row is set to the "L" level and the data read bit line RBL of the non-selected column is set to the "H" level. Further, all of the data write bit lines WBL and /WBL are set to the "L" level. When data is read out, a path configured by the read driver transistor RD1 and read transfer gate RT1 is used, the ON/OFF state of the read driver transistor RD1 of the selected memory cell is changed according to the stored data and data can be fetched onto the data read bit line RBL.

Like the case of data writing, in the memory cell array having the SRAM memory cells of FIG. 2 arranged in a matrix form, the read transfer gates RT1 of all of the memory cells connected to the word line WL on the same row as that of the selected cell are turned ON when data is read out from the selected cell. However, when the read transfer gate RT1 is turned ON, the source and drain terminals of the read transfer gate RT1 are not connected to the data latch circuit. Therefore, even if a memory cell having a small SNM and low data stability is present, it can be prevented that the "H" level of the data read bit line RBL is transmitted to the data latch circuit to exert influence on stored data.

Further, like the case of the data write operation, at the data read time, the data write transfer gates WT1 and WT2 of all of the memory cells connected to the word line on the same row as that of the selected cell are set into the ON state. However, all of the data write bit lines WBL and /WBL are fixed at the "L" level and the write buffer transistors WD1 and WD2 are both set in the OFF state. Therefore, even if a memory cell having a small SNM and low data stability is present, data can be prevented from being destroyed.

Thus, in the memory cell array having the memory cells of FIG. 1 arranged in a matrix form, a problem of read disturb can be solved.

Second Embodiment

In the semiconductor memory device according to the first embodiment described above, the word line WL of the selected row is set at the "H" level when data is written into the selected cell and one of the data write bit lines WBL and /WBL of the selected column is set to the "L" level and the other bit line is set to the "H" level according to data to be written. At this time, the write buffer transistors WD1 and WD2 are required to have large driving power, that is, large channel widths of the transistors in order to cope with a case where data which is inverse to stored data of the data latch circuit is written. Therefore, the area of the memory cell is increased accordingly. A second embodiment in which the above point is improved is explained below.

Figure 5:
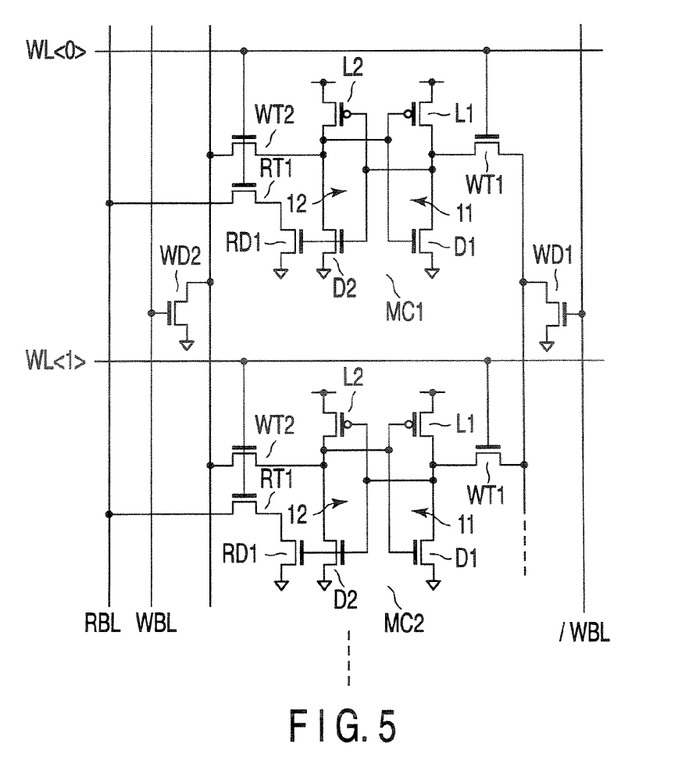
FIG. 5 is a circuit diagram showing an extracted portion of a memory cell array of an SRAM, for illustrating a semiconductor memory device according to a second embodiment of this invention.

FIG. 5 is a circuit diagram showing an extracted portion of a memory cell array of an SRAM, for illustrating a semiconductor memory device according to the second embodiment of this invention. In FIG. 5, only two memory cells MC1, MC2 which are adjacent in the column direction are shown. Write buffer transistors WD1, WD2 are commonly used by a plurality of memory cells on the same column containing the two memory cells MC1, MC2. That is, the other terminals of the source and drain terminals of the data write transfer gates WT1 of the respective memory cells are commonly connected and the source and drain terminals of the write buffer transistor WD1 are connected to the common connection node and a reference potential node. Likewise, the other terminals of the source and drain terminals of the data write transfer gates WT2 of the respective memory cells are commonly connected and the source and drain terminals of the write buffer transistor WD2 are connected to the common connection node and the reference potential node.

In the memory cell array of FIG. 5, the operation of writing data into a selected cell and the operation of reading out data from the selected cell are exactly the same as those of the memory cells shown in FIGS. 1 and 2.

In the present embodiment, since the write buffer transistors WD1 and WD2 can be commonly used by a plurality of (n) memory cells arranged on the same column, the occupied area of the transistors WD1, WD2 for each cell can be reduced to 1/n times if the sizes of the transistors WD1, WD2 are kept unchanged. Therefore, the effect that the area of the memory cell can be reduced can be attained.

Third Embodiment

Figure 6:
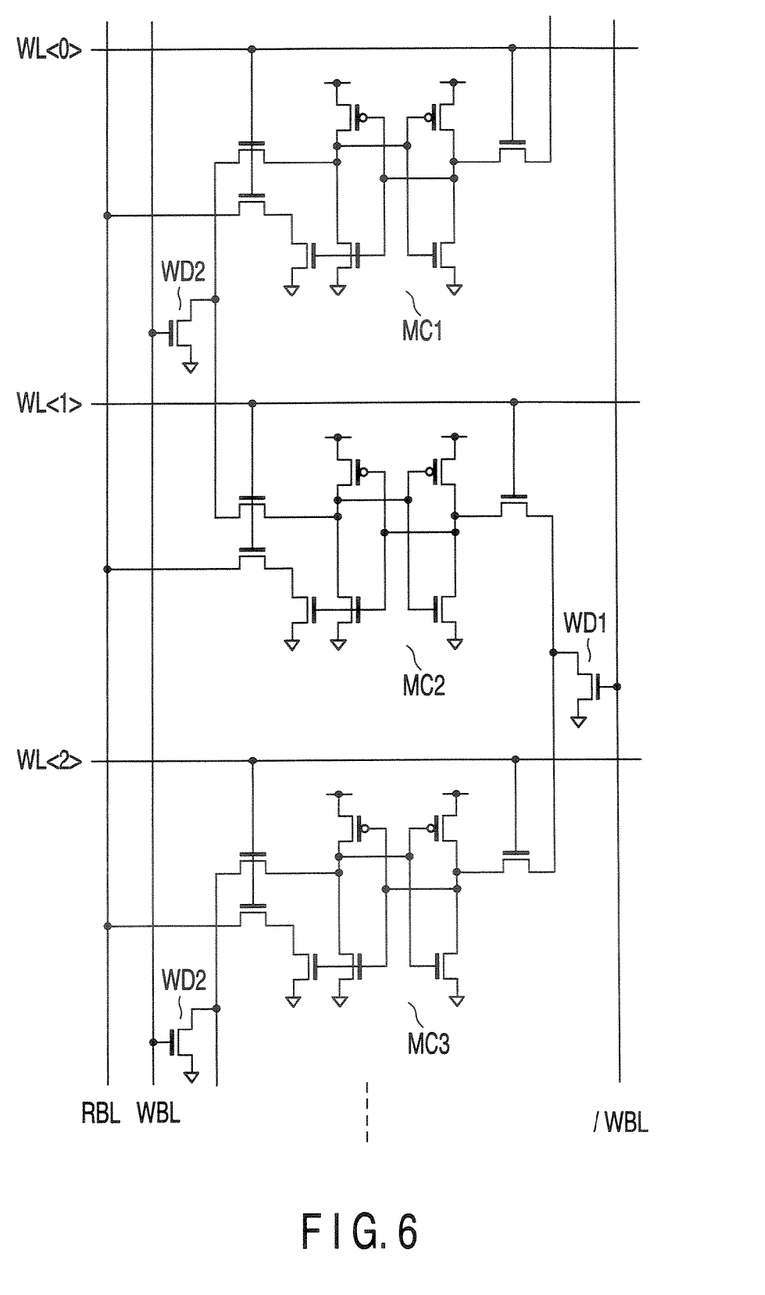
FIG. 6 is a circuit diagram showing an extracted portion of a memory cell array of an SRAM, for illustrating a semiconductor memory device according to a third embodiment of this invention.

FIG. 6 is a circuit diagram showing an extracted portion of a memory cell array of an SRAM, for illustrating a semiconductor memory device according to a third embodiment of this invention. In FIG. 6, only three memory cells MC1, MC2, MC3 which are successively arranged in the column direction are shown. Write buffer transistors WD1 and WD2 are commonly used by two memory cells which are arranged adjacent in the column direction. That is, the write buffer transistor WD1 is commonly used by the memory cell MC2 and the memory cell MC3 which is adjacent to the memory cell MC2 in the downward direction (first direction). Further, the write buffer transistor WD2 is commonly used by the memory cell MC2 and the memory cell MC1 which is adjacent to the memory cell MC2 in the upward direction (second direction).

In the memory cell array of FIG. 6, the operation of writing data into a selected cell and the operation of reading out data from the selected cell are the same as those of the memory cells shown in FIG. 2 or 5.

In the present embodiment, since each of the write buffer transistors WD1 and WD2 can be commonly used by the two memory cells adjacent in the column direction, the occupied area of the transistors WD1, WD2 for each cell can be reduced to half if the sizes of the transistors WD1, WD2 are kept unchanged. Therefore, the effect that the area of the memory cell can be reduced can be attained.

Figure 7:
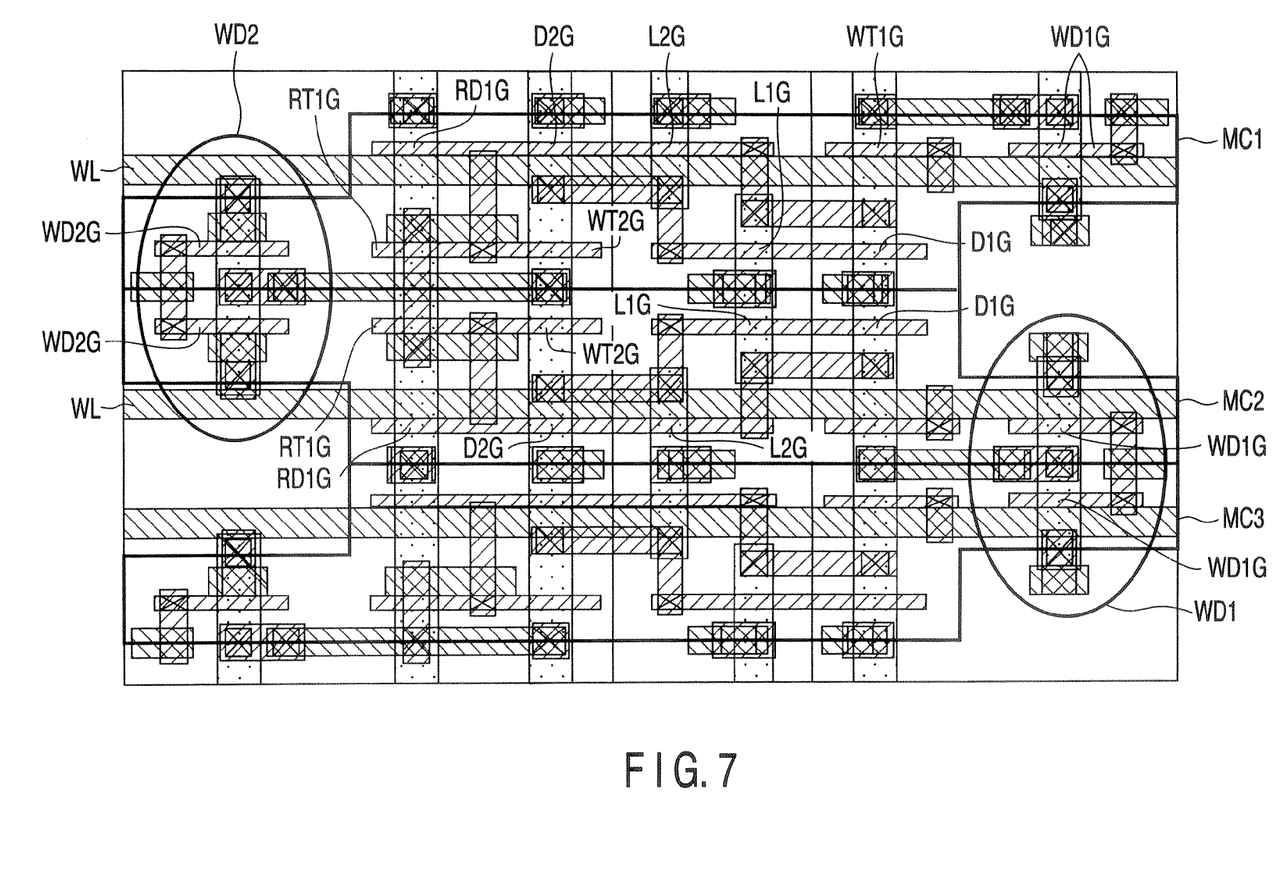
FIG. 7 is a plan view of a pattern layout example of part of the memory cell array shown in FIG. 6.

FIG. 7 is a plan view showing a pattern layout example of the memory cell array shown in FIG. 6. In this case, an example of the plane pattern which is preferable when the memory cell array of FIG. 6 is laid out on a chip is shown. In the respective cell areas of the memory cells MC1 to MC3, gate portions L1G, L2G of transistors L1, L2, gate portions D1G, D2G of transistors D1, D2, gate portions WT1G, WT2G of data write transfer gates WT1, WT2, gate portions WD1G, WD2G of the write buffer transistors WD1, WD2, gate portion RD1G of a read driver transistor RD1 and gate portion RT1G of a read transfer gate RT1 are arranged. Further, terminal-terminal connection wiring portions, word line wiring portions, data write bit line wiring portions, data read bit line wiring portions, power supply wiring portions and contact portions are also arranged.

As shown in FIG. 6, a pair of cross-coupled inverters 11 (L1, L2), 12 (L2, D2) which store cell data are arranged in point-symmetrical positions in each of the cell areas of the memory cells MC1 to MC3. The patterns of two cell areas which are adjacent in the vertical direction (bit line direction, column direction) in the drawing have layouts which are inverted in the vertical direction (line symmetrical). That is, the cell area of the memory cell MC2 has a pattern layout which is line-symmetrical with respect to the cell areas of the memory cells MC1 and MC3 and the pattern layouts of the cell areas of the memory cells MC1 and MC3 are set in the same direction. With the above layouts, an advantage that contacts connected to the power supply lines and bit lines in the boundary area between the cell areas can be commonly used and the cell area can be made small can be attained.

Further, the write buffer transistor WD2 is commonly used by the two cell areas of the memory cells MC1 and MC2 which are adjacent in the column direction and the write buffer transistor WD1 is commonly used by the two cell areas of the memory cells MC2 and MC3 which are adjacent in the column direction. As a result, the cell area can be made small. In the forming area of the transistors, WD1, WD2, each transistor is configured by two parallel-connected transistors.

One of the source and drain terminals of the transistor WD1 which is not connected to the reference potential node and one of the source and drain terminals of the transistor WD2 which is not connected to the reference potential node are arranged in point-symmetrical positions. For example, attention is paid to the cell area of the memory cell MC2. Then, one of the source and drain terminals of the write buffer transistor WD1 which is not connected to the reference potential node is arranged in the lower right portion of the cell area of the memory cell MC2 in the drawing and one of the source and drain terminals of the write buffer transistor WD2 which is not connected to the reference potential node is arranged in the upper left portion of the cell area of the memory cell MC2 in the drawing. In the memory cell MC1 which is adjacent to the memory cell MC2 in the upward direction, one of the source and drain terminals of the write buffer transistor WD2 which is not connected to the reference potential node is arranged in the lower left portion of the cell area of the memory cell MC1 in the drawing. Further, one of the source and drain terminals of the write buffer transistor WD1 which is not connected to the reference potential node is arranged in the upper right portion of the cell area of the memory cell MC1 in the drawing. In addition, in the memory cell MC3 which is adjacent to the memory cell MC2 in the downward direction, one of the source and drain terminals of the write buffer transistor WD1 which is not connected to the reference potential node is arranged in the upper right portion of the cell area of the memory cell MC3 in the drawing and one of the source and drain terminals of the write buffer transistor WD2 which is not connected to the reference potential node is arranged in the lower left portion of the cell area of the memory cell MC3 in the drawing.

Then, first memory cell areas each having a first pattern layout such as the pattern layout of the memory cell MC1 and second memory cell areas each of which has a second pattern layout such as the pattern layout of the memory cell MC2 and is line-symmetrical with respect to the first pattern layout are alternately arranged in the column direction. Further, rows in which the first memory cell areas are successively and repeatedly arranged in the row direction and rows in which the second memory cell areas are successively and repeatedly arranged in the row direction are alternately arranged in the column direction.

In the pattern layout of the memory cell array shown in FIG. 7, an area in which a write buffer transistor commonly used by two cell areas adjacent in the column direction is arranged forms a projected pattern area. For example, an area in which the write buffer transistor WD1 of the cell areas of the memory cells MC2 and MC3 is arranged forms a projected pattern area which projects on the right side in the row direction of the memory cell area. Further, an area in which the write buffer transistor WD2 of the cell areas of the memory cells MC1 and MC2 is arranged forms a projected pattern area which projects on the left side in the row direction of the memory cell area. In addition, depressed pattern areas which are depressed are formed in correspondence to the projected pattern areas. The cell areas adjacent in the row direction are arranged so that the projected pattern area of one of the cell areas will be inserted into the depressed pattern area of the other cell area. As a result, an advantage that no dead space will be formed in the pattern layout of the memory cell array can be attained.

As descried above, when the write buffer transistors WD1 and WD2 are commonly used in the two cell areas which are adjacent in the column direction and if the configuration shown in FIG. 6 and the layout shown in FIG. 7 are used, the cell area can be made smaller than in a case wherein the configuration shown in FIG. 5 is used.

Therefore, according to one aspect of this invention, the SNM of the SRAM cell can be prevented from becoming smaller with a lowering in the power supply voltage and a lowering in the threshold voltage of the transistor and occurrence of write disturb and read disturb can be prevented.

In the above embodiments, a case wherein the SRAM is used as an example is explained, but this invention can be applied to a semiconductor device having a memory and logical circuit mounted on one chip or generally applied to an LSI having an SRAM such as an SOC (system on chip) mounted thereon.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory cell comprising:
   first and second inverters having input terminals respectively connected to output terminals of the other inverters,
   a first write transfer gate having one of source and drain terminals connected to a first common connection node of the output terminal of the first inverter and the input terminal of the second inverter and a gate terminal connected to a word line,
   a second write transfer gate having one of source and drain terminals connected to a second common connection node of the output terminal of the second inverter and the input terminal of the first inverter and a gate terminal connected to the word line,
   a first write buffer transistor having one of source and drain terminals connected to the other one of the source and drain terminals of the first write transfer gate, the other one of the source and drain terminals connected to a reference potential node and a gate terminal connected to a first bit line,
   a second write buffer transistor having one of source and drain terminals connected to the other one of the source and drain terminals of the second write transfer gate, the other one of the source and drain terminals connected to the reference potential node and a gate terminal connected to a second bit line,
   a read transfer gate having one of source and drain terminals connected to a third bit line and a gate terminal connected to the word line, and
   a read driver transistor having one of source and drain terminals connected to the other one of the source and drain terminals of the read transfer gate, the other one of the source and drain terminals connected to the reference potential node and a gate terminal connected to the first common connection node.

2. The memory cell according to claim 1, wherein the first and second bit lines are used for data writing and the third bit line is used for data reading.

3. The memory cell according to claim 1, wherein potential of the word line is set to an "H" level when data is written into the memory cell, potential of one of the first and second bit lines is set to an "L" level and potential of the other one of the bit lines is set to the "H" level according to data to be written and potential of the third bit line is set to one of the "H" level and "L" level.

4. The memory cell according to claim 1, wherein potentials of the word line and third bit line are set to an "H" level when data is read out from the memory cell and data is read out and supplied to the third bit line based on an ON/OFF state of the read driver transistor corresponding to a latch state by the first and second inverters.

5. A semiconductor memory device comprising:
   a memory cell array having memory cells arranged in a matrix form,
   word lines each commonly connected to those of the memory cells which lie on the same row in the memory cell array, and
   first, second and third bit lines of groups each commonly connected to those of the memory cells which lie on the same column in the memory cell array,
   wherein each of the memory cells includes:
   first and second inverters having input terminals respectively connected to output terminals of the other inverters,
   a first write transfer gate having one of source and drain terminals connected to a first common connection node of the output terminal of the first inverter and the input terminal of the second inverter and a gate terminal connected to a corresponding one of the word lines,
   a second write transfer gate having one of source and drain terminals connected to a second common connection node of the output terminal of the second inverter and the input terminal of the first inverter and a gate terminal connected to the word line,
   a first write buffer transistor having one of source and drain terminals connected to the other one of the source and drain terminals of the first write transfer gate, the other one of the source and drain terminals connected to a reference potential node and a gate terminal connected to the first bit line,
   a second write buffer transistor having one of source and drain terminals connected to the other one of the source and drain terminals of the second write transfer gate, the other one of the source and drain terminals connected to the reference potential node and a gate terminal connected to the second bit line,
   a read transfer gate having one of source and drain terminals connected to the third bit line and a gate terminal connected to the word line, and
   a read driver transistor having one of source and drain terminals connected to the other one of the source and drain terminals of the read transfer gate, the other one of the source and drain terminals connected to the reference potential node and a gate terminal connected to the first common connection node.

6. The semiconductor memory device according to claim 5, wherein the first and second bit lines are used for data writing and the third bit line is used for data reading.

7. The semiconductor memory device according to claim 6, wherein potential of the word line of a selected row is set to an "H" level and potential of the word lines of a non-selected rows are set to an "L" level when data is written into a selected one of the memory cells, potential of one of the first and second bit lines of a selected column is set to the "L" level and potential of the other one of the first and second bit lines is set to the "H" level according to data to be written and potential of the bit line of a non-selected columns are set to the "L" level, and potentials of all of the third bit lines are set to one of the "H" level and "L" level.

8. The semiconductor memory device according to claim 6, wherein potential of the word line of a selected row is set to an "H" level and potential of the word line of a non-selected rows are set to an "L" level when data is read out from a selected one of the memory cells, potentials of the first and second bit lines of a selected column are set to the "L" level, potential of the third bit lines are initial setting to an "H" level, and the third bit lines are set to a potential corresponding to data read out from the selected memory cell.

9. The semiconductor memory device according to claim 8, wherein the potential of the third bit line is set based on an ON/OFF state of the read driver transistor corresponding to a latch state by the first and second inverters.

10. The semiconductor memory device according to claim 5, wherein the first and second write buffer transistors are commonly used by a plurality of memory cells arranged on the same column.

11. The semiconductor memory device according to claim 5, wherein the first write buffer transistor is commonly used by two memory cells which are adjacent in the column direction and the second buffer transistor is commonly used by two memory cells which are adjacent in the column direction.

12. The semiconductor memory device according to claim 5, wherein first memory cell areas each having a first pattern layout and second memory cell areas each having a second pattern layout which is line-symmetrical with respect to the first pattern layout are alternately arranged in the column direction and rows on which the first memory cell areas are successively and repeatedly arranged in the row direction and rows on which the second memory cell areas are successively and repeatedly arranged in the row direction are alternately arranged in the column direction in the memory cell array.

13. The semiconductor memory device according to claim 12 wherein the first write buffer transistor of the first memory cell area is arranged adjacent in the column direction to the first write buffer transistor of the second memory cell area arranged adjacent in a first direction of the column direction to the first memory cell area and the second write buffer transistor of the first memory cell area and the second write buffer transistor of the second memory cell area which is arranged adjacent to the first memory cell area in a second direction opposite to the first direction of the column direction are arranged adjacent in the column direction in the memory cell array.

* * * * *